US012616027B2

(12) United States Patent
Lin et al.

(10) Patent No.: US 12,616,027 B2
(45) Date of Patent: Apr. 28, 2026

(54) SEMICONDUCTOR PACKAGE STRUCTURES AND METHODS OF FORMING THE SAME

(71) Applicant: Taiwan Semiconductor Manufacturing Company, Ltd., Hsinchu (TW)

(72) Inventors: Yu-Sheng Lin, Zhubei (TW); Chien Hung Chen, Taipei (TW); Po-Chen Lai, Hsinchu (TW); Chin-Hua Wang, New Taipei City (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 781 days.

(21) Appl. No.: 17/663,793

(22) Filed: May 17, 2022

(65) Prior Publication Data

US 2023/0378024 A1 Nov. 23, 2023

(51) Int. Cl.
*H01L 23/467* (2006.01)
*H01L 21/48* (2006.01)
(Continued)

(52) U.S. Cl.
CPC ........ *H01L 23/467* (2013.01); *H01L 21/4882* (2013.01); *H01L 25/0655* (2013.01); *H01L 23/49811* (2013.01); *H01L 23/49833* (2013.01); *H01L 24/32* (2013.01); *H01L 2224/32225* (2013.01); *H01L 2924/1611* (2013.01); *H01L 2924/16251* (2013.01);
(Continued)

(58) Field of Classification Search
CPC ................. H01L 23/585; H01L 23/562; H01L 2224/13155; H01L 2224/1316; H01L 2224/05647; H01L 23/467; H01L 23/04; H01L 24/16; H01L 24/05; H01L 2924/00014; H01L 2924/15311; H01L 23/552; H01L 24/32; H01L 2224/48091; H01L 2924/3511; H01L 25/0657; H01L 2924/181; H01L 2224/16225; H01L 2224/32225; H01L 2224/73204; H01L 24/73; H01L 2924/14; H01L 2924/3025; H10B 43/27; H10B 43/40; H10B 43/50; H10B 41/27
See application file for complete search history.

(56) References Cited

U.S. PATENT DOCUMENTS

| | | | | |
|---|---|---|---|---|
| 5,734,553 A | * | 3/1998 | Hong ..................... | H01L 23/467 257/722 |
| 2023/0147273 A1 | * | 5/2023 | Degner ................... | H01L 25/18 257/737 |
| 2023/0299013 A1 | * | 9/2023 | Bacha ..................... | H01L 24/32 257/737 |

* cited by examiner

*Primary Examiner* — Jessica S Manno
*Assistant Examiner* — Victor Joseph Lasasso
(74) *Attorney, Agent, or Firm* — Harrity & Harrity, LLP

(57) ABSTRACT

A ring structure on a package substrate is divided into at least four different components, including a plurality of first pieces and a plurality of second pieces. By dividing the ring structure into at least four different components, the ring structure reduces flexibility of the package substrate, which thus reduces stress on a molding compound (e.g., in a range from approximately 1% to approximately 10%). As a result, molding cracking is reduced, which reduces defect rates and increases yield. Accordingly, raw materials, power, and processing resources are conserved that would otherwise be consumed with manufacturing additional packages when defect rates are higher.

20 Claims, 12 Drawing Sheets

200

200

(51) Int. Cl.
    *H01L 23/00*       (2006.01)
    *H01L 23/498*     (2006.01)
    *H01L 25/065*     (2023.01)

(52) U.S. Cl.
    CPC ................. *H01L 2924/1632* (2013.01); *H01L 2924/1659* (2013.01); *H01L 2924/16747* (2013.01); *H01L 2924/1676* (2013.01); *H01L 2924/182* (2013.01); *H01L 2924/3511* (2013.01); *H01L 2924/3512* (2013.01); *H01L 2924/37001* (2013.01)

200

218
216
214
212

208
206    204b    206    204a    206
208
210
202

218
216
214
212

450

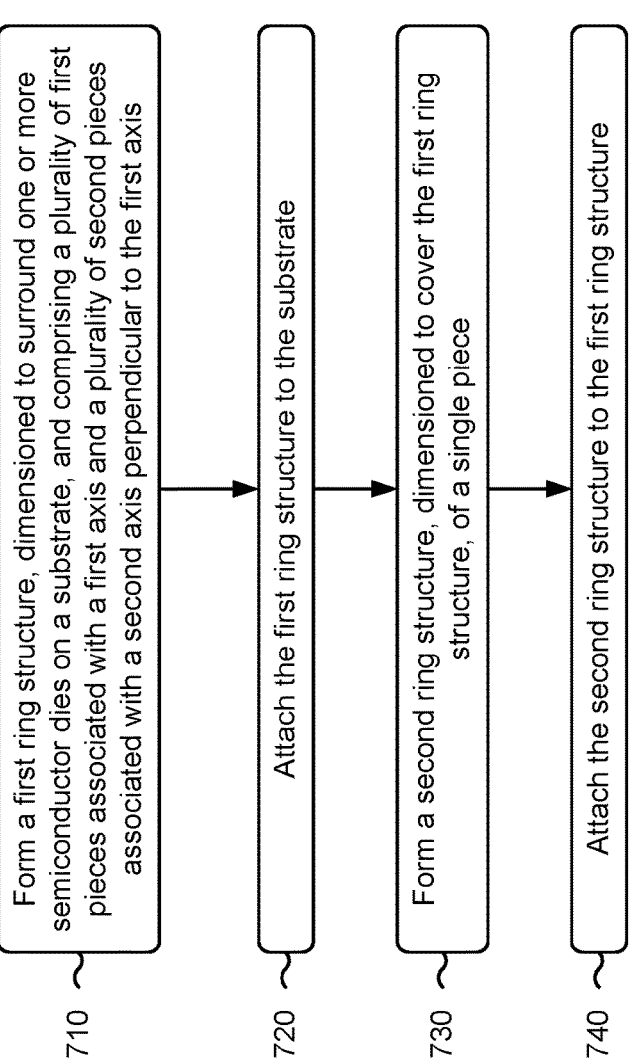

710 Form a first ring structure, dimensioned to surround one or more semiconductor dies on a substrate, and comprising a plurality of first pieces associated with a first axis and a plurality of second pieces associated with a second axis perpendicular to the first axis 720 Attach the first ring structure to the substrate 730 Form a second ring structure, dimensioned to cover the first ring structure, of a single piece 740 Attach the second ring structure to the first ring structure

SEMICONDUCTOR PACKAGE STRUCTURES AND METHODS OF FORMING THE SAME

BACKGROUND

In the packaging of integrated circuits, semiconductor dies may be stacked through bonding and may be bonded to other package components such as interposers and package substrates. The resulting packages are known as three dimensional integrated circuits (3DICs). Warpage control for the package substrate is usually performed by depositing rings, surrounding semiconductor dies, on the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of an example process associated with forming semiconductor packages described herein.

DETAILED DESCRIPTION

Figure 1:
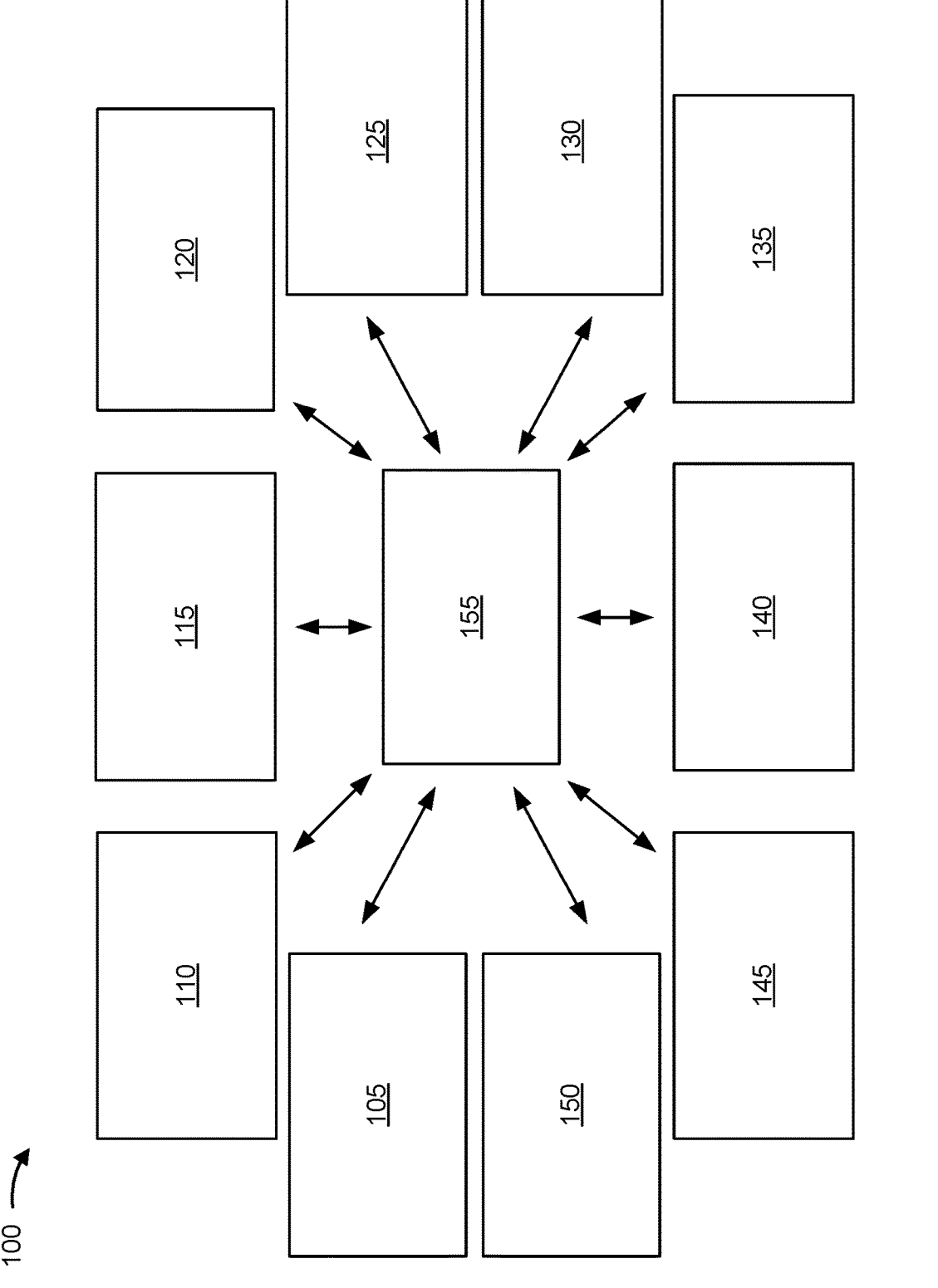
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the packaging of integrated circuits (ICs), semiconductor dies may be stacked through bonding and may be bonded to other package components such as interposers and package substrates. The resulting packages are known as three-dimensional ICs (3DICs). Generally, the semiconductor dies are resilient to induced stress when the package substrate is stressed (e.g., due to tensile and compressive forces). For example, thermal changes in an environment of the 3DIC may induce stress on the package substrate. Additionally, or alternatively, the package substrate may be mechanically flexed during installation and/or use of the 3DIC. However, the stacked dies are generally molded in a molding compound, which sometimes may be formed of a rigid material. These rigid materials have a tendency to crack under induced stress, particularly for larger packages.

Some implementations described herein provide techniques and apparatuses for a ring structure on a package substrate to be divided into at least four different components, including a plurality of first pieces and a plurality of second pieces. For example, each piece may be adhered along a corresponding side of the rectangular package substrate. At least one of the first pieces may be separated from at least one of the second pieces by no more than approximately 1% of a length of a smallest of the pieces. The first pieces may be formed of a material having a coefficient of linear thermal expansion (CTE) of no more than approximately 2.5 parts per million (ppm) per degree Celsius (° C.) (ppm/° C.). Using no more than 2.5 ppm/° C. reduces stress on the molding compound by reducing flexibility of the package substrate. For example, the first pieces may be formed of a 36% nickel-iron alloy.

By dividing the ring structure into at least four different components, the ring structure reduces flexibility of the package substrate, which thus reduces stress on a molding compound (e.g., in a range from approximately 1% to approximately 10%). As a result, molding cracking is reduced, which reduces defect rates and increases yield. Accordingly, raw materials, power, and processing resources are conserved that would otherwise be consumed with manufacturing additional packages when defect rates are higher.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an interconnect tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a series of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a series of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical interconnect access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, a spin coating tool, and/or a plating tool, among other examples). The RDL tool set 105 may further include a bonding/debonding tool for joining, and/or separating, semiconductor substrates (e.g., semiconductor wafers). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The interconnect tool set 115 includes one or more tools that are capable of forming interconnect structures (e.g., electrically-conductive structures) as part of the semiconductor package. The interconnect structures formed by the interconnect tool set 115 may include a wire, a stud, a pillar, a bump, or a solderball, among other examples. The interconnect structures formed by the interconnect tool set 115 may include materials such as a gold (Au) material, a copper (Cu) material, a silver (Ag) material, a nickel (Ni) material, a tin (Sn) material, or a palladium (Pd) material, among other examples. The interconnect tool set 115 may include a bumping tool, a wirebond tool, or a plating tool, among other examples. In some implementations, the example environment 100 includes a plurality of types of such tools as part of the interconnect tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a laminating tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms the interposer and/or the substrate. The PCB tool set 140 may include a laminating tool, a plating tool, a photoengraving tool, a laser cutting tool, a pick-and-place tool, an etching tool, a dispense tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform a series of operations. For example, and as described in greater detail in connection with FIGS. 2A, 2B, 2C, 3A, 3B, 4A, 4B, 5A, 5B, 6, and 7 and elsewhere herein, the series of operations may include forming a first ring structure dimensioned to surround one or more semiconductor dies on a substrate, the first ring structure including a plurality of first pieces associated with a first axis and a plurality of second pieces associated with a second axis perpendicular to the first axis. The series of operations may further include forming a second ring structure dimensioned to cover the first ring structure, the second ring structure being formed of a single piece. The series of operations may therefore include attaching the first ring structure to the substrate and attaching the second ring structure to the first ring structure.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
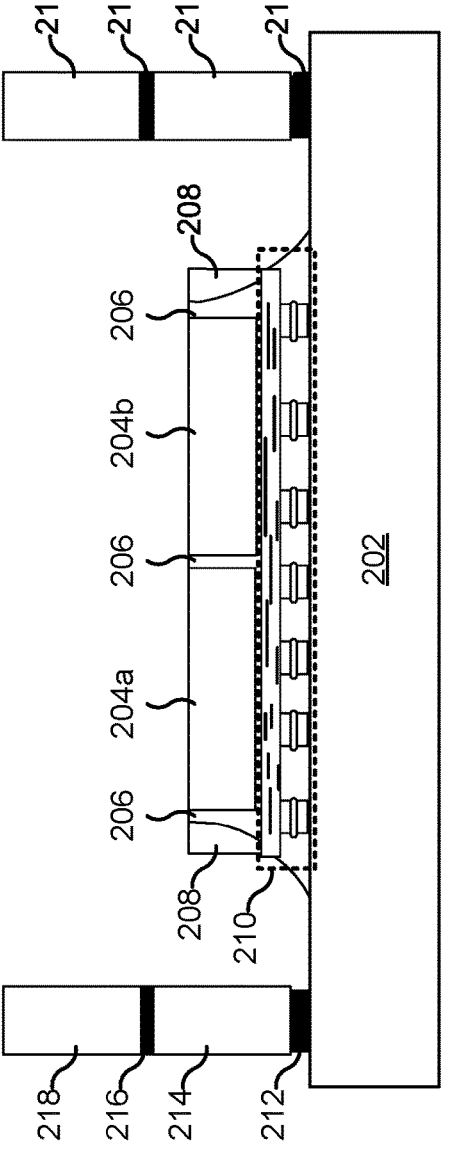
FIGS. 2A-2C are diagrams of an example implementation described herein.
Figure 2B:
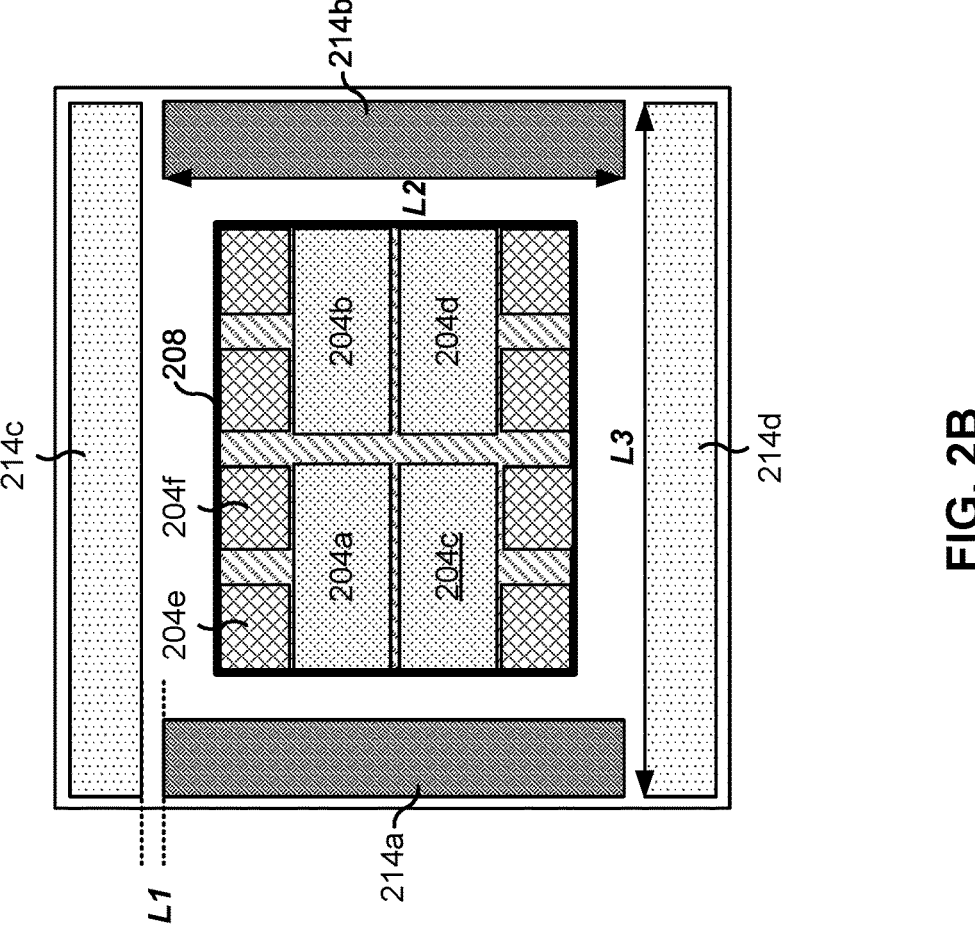
Figure 2C:
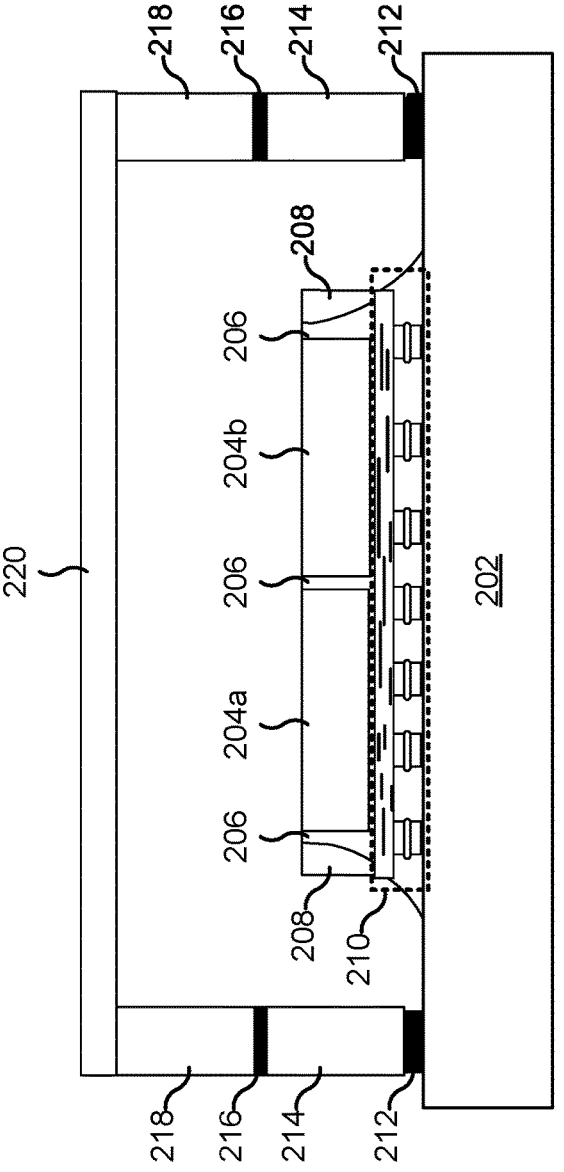

FIGS. 2A-2C are diagram of an example implementation 200 of an electronics package (or another semiconductor package) described herein. In some implementations, the semiconductor package corresponds to a 3DIC. FIG. 2A represents a side view of the semiconductor package.

As shown in FIG. 2A, the semiconductor package may be mounted on a substrate 202 having one or more layers of electrically-conductive traces. The substrate 202 may include one or more layers of a dielectric material, such as a ceramic material or a silicon material. In some implementations, the substrate 202 corresponds to a printed circuit board (PCB) including layers of a glass-reinforced epoxy laminate material and/or a pre-preg material (e.g., a composite fiber/resin/epoxy material), among other examples. Additionally, or alternatively, one or more layers of the substrate 202 may include a buildup film material.

The electrically-conductive traces on the substrate 202 may include one or more materials such as a gold (Au) material, a copper (Cu) material, a silver (Ag) material, a nickel (Ni) material, a tin (Sn) material, or a palladium (Pd) material, among other examples. In some implementations, the substrate 202 includes one or more conductive vertical access interconnect structures (vias) that connect one or more layers of the electrically-conductive traces.

As further shown in FIG. 2A, the semiconductor package may include one or more semiconductor dies (e.g., a system-on-chip (SoC) IC die 204a and/or a dynamic random access memory (DRAM) IC die 204b, among other examples). An underfill material 206 may connect the semiconductor dies 204a and 204b and an interposer 210, as described below. The underfill material 206 may include an epoxy polymer underfill material, among other examples. For example, a dispense tool of the encapsulation tool set 135 may dispense the underfill material 206.

A molding 208 may encapsulate one or more portions of the semiconductor package, including portions of the semiconductor dies 204a and 204b. The molding 208 (e.g., a plastic mold compound, among other examples) may protect the semiconductor dies 204a and 204b from damage during manufacturing of the semiconductor package and/or during field use of the semiconductor package.

For example, a mold tool of the encapsulation tool set 135, may encapsulate the semiconductor dies 204a and 204b and the underfill material 206 within the molding 208. Further, the grinding tool of the CMP of the planarization tool set 110 may planarize the molding 208.

The semiconductor package may further include an interposer 210 having one or more layers of electrically-conductive traces. The electrically-conductive traces may include one or more materials such as a gold (Au) material, a copper (Cu) material, a silver (Ag) material, a nickel (Ni) material, a tin (Sn) material, or a palladium (Pd) material, among other examples. In some implementations, as shown in FIG. 2A, the interposer 210 includes one or more conductive vertical access interconnect structures (vias) that connect one or more layers of the electrically-conductive traces.

The interposer 210 may include one or more layers of a dielectric material, such as a ceramic material or a silicon material. In some implementations, the interposer 210 corresponds to a PCB including layers of a glass-reinforced epoxy laminate material and/or a pre-preg material (e.g., a composite fiber/resin/epoxy material), among other examples. Additionally, or alternatively, one or more layers of the interposer 210 may include a buildup film material.

For example, the plating tool of the interconnect tool set 115 and pick-and-place/reflow tools of the die-attach tool set 130, may attach the semiconductor dies 204a and 204b to the interposer 210.

The semiconductor dies 204a and 204b may be connected (e.g., mounted) to the interposer 210 using interconnect structures. The interconnect structures may include one or more combinations of a stud, a pillar, a bump, or a solderball, among other examples. The interconnect structures may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

For example, the spin coating tool of the RDL tool set 105 may deposit one or more layer of a polyimide material on a temporary carrier (e.g., a silicon wafer, among other examples) and the plating tool of the RDL tool set 105 may deposit electrically-conductive traces (e.g., RDL traces) and a portion of the interconnect structures.

As further shown in FIG. 2A, a first adhesive 212 may connect a first ring structure 214 to the substrate 202. The first adhesive 212 may include an epoxy adhesive, among other examples. Additionally, a second adhesive 216 may connect a second ring structure 218 to the first ring structure 214. The second adhesive 216 may include an epoxy adhesive, among other examples. In some implementations, the first and second adhesives 212 and 216 may be the same material. Alternatively, the second adhesive 216 may be selected to have a different hardness, a different melting point, and/or a different bonding time than the first adhesive 212. As described herein, the first ring structure 214 may be formed of a plurality of components while the second ring structure 218 is formed of a single piece (e.g., dimensioned to surround the semiconductor dies 204a and 204b and the molding 208).

FIG. 2B represents a top view of the of the semiconductor package. As shown in FIG. 2B, the semiconductor package may include one or more additional dies (e.g., high bandwidth memory (HBM) IC die 204c and HBM IC die 204d).

Additionally, as shown in FIG. 2B, the first ring structure 214 is divided into a plurality of first pieces 214a and 214b and a plurality of second pieces 214c and 214d. In some implementations, the substrate 202 is substantially rectangular (e.g., having four corners with angles that are in a range from approximately 88° to approximately 92°) such that the first pieces 214a and 214b are substantially perpendicular to the second pieces 214c and 214d. As used herein, "substantially perpendicular" refers to an angle formed by first piece 214a and second piece 214c (or second piece 214d) and an angle formed by first piece 214b and second piece 214d (or second piece 214c) in a range from approximately 88° to approximately 92°.

The first pieces 214a and 214b and the second pieces 214c and 214d may be associated with a spacing L1. For example, the spacing L1 may represent a shortest distance between one of the first pieces (first piece 214a in example implementation 200) and a corresponding one of the second pieces (second piece 214c in example implementation 200). The spacing L1 may be in a range from approximately 0.01% to approximately 1.0% of a length associated with the first pieces (e.g., L2 as described below). Additionally, or alternatively, the spacing L1 may be in a range from approximately 0.01% to approximately 1.0% of a length associated with the second pieces (e.g., L3 as described below). By selecting at least 0.01% of the length, the substrate 202 may maintain some ability to flex (e.g., during installation and/or use) without warping. By selecting at least 1.0% of the length, stressing forces on the substrate 202 are reduced to prevent cracking of, and/or other defects forming in, the molding 208.

Accordingly, each first piece 214a and 214b may be associated with a first axis (shown as a vertical axis in FIG. 2B) and have a length L2 along the first axis. Similarly, each second piece 214c and 214d may be associated with a second axis, perpendicular to the first axis (shown as a horizontal axis in FIG. 2B), and have a length L3 along the second axis. In some implementations, as shown in FIG. 2B, the first pieces 214a and 214b may be associated with a length L2 that is shorter than a length L3 associated with the second pieces 214c and 214d. For example, the first pieces 214a and 214b may be formed of a less flexible material than the second pieces 214c and 214d, as described below, such that the shorter length L2 preserves some ability of the substrate 202 to flex (e.g., during installation and/or use) without warping. Additionally, in some implementations, the first pieces 214a and 214b may be associated with shorter sides of the substrate 202 than the second pieces 214c and 214d.

Alternatively, the first pieces 214a and 214b may be associated with a length L2 that is longer than a length L3 associated with the second pieces 214c and 214d. For example, the first pieces 214a and 214b may be formed of a less flexible material than the second pieces 214c and 214d, as described below, such that the longer length L2 further limits stressing forces on the substrate 202 to prevent cracking of, and/or other defects forming in, the molding 208. Additionally, in some implementations, the first pieces 214a and 214b may be associated with longer sides of the substrate 202 than the second pieces 214c and 214d.

In some implementations, the first and second pieces may be formed of a same material. Alternatively, to control warpage of the substrate 202 along the first axis differently than warpage of the substrate 202 along the second axis, the first pieces 214a and 214b may be formed of a different material than the second pieces 214c and 214d. For example, the first pieces 214a and 214b may be formed of a material with a coefficient of thermal expansion in a range from approximately 0.1 ppm/° C. to approximately 2.5 ppm/° C. For example, the first pieces 214a and 214b may be formed of a 36% nickel-iron alloy (also referred to as "INVAR36"). By selecting no more than 2.5 ppm/° C., stressing forces on the substrate 202 are reduced to prevent cracking of, and/or other defects forming in, the molding 208. By selecting at least 0.1 ppm/° C., the substrate 202 retains at least some ability to flex without warping, which is helpful during installation and/or use of the electronics package.

Additionally, or alternatively, the second pieces 214c and 214d may be formed of a material with a coefficient of thermal expansion in a range from approximately 16.0 ppm/° C. to approximately 20.0 ppm/° C. For example, the second pieces 214c and 214d may be formed of a stainless steel (also referred to as "SS" or "SUS") and/or copper (Cu). By selecting no more than 20.0 ppm/° C., stressing forces on the substrate 202 are reduced to prevent cracking of, and/or other defects forming in, the molding 208. By selecting at least 16.0 ppm/° C., the substrate 202 retains at least some ability to flex without warping, which is helpful during installation and/or use of the electronics package.

By using multiple pieces as described in connection with FIG. 2B, the first ring structure 214 reduces stress on the molding 208 (e.g., in a range from approximately 1% to approximately 10%) while still allowing some flexibility for substrate 202. As a result, cracking of the molding 208 is reduced, which reduces defect rates and increases yield. Accordingly, raw materials, power, and processing resources are conserved that would otherwise be consumed with manufacturing additional packages when defect rates are higher.

FIG. 2C represents a side view of the of the semiconductor package with a heat dissipation device 220 mounted over the semiconductor dies 204a and 204b and supported by the second ring structure 218. For example, the heat dissipation device 220 may be placed, attached via connectors (e.g., screws, pins, and/or other similar hardware), and/or adhered (e.g., via an epoxy adhesive and/or another type of adhesive) to the second ring structure 218. The heat dissipation device 220 may include a fan and/or another similar type of hardware that causes heat generated during use of the semiconductor dies 204a and 204b to an environment outside the semiconductor dies 204a and 204b.

As indicated above, FIGS. 2A-2C are provided as an example. Other examples may differ from what is described with regard to FIGS. 2A-2C.

Figure 3A:
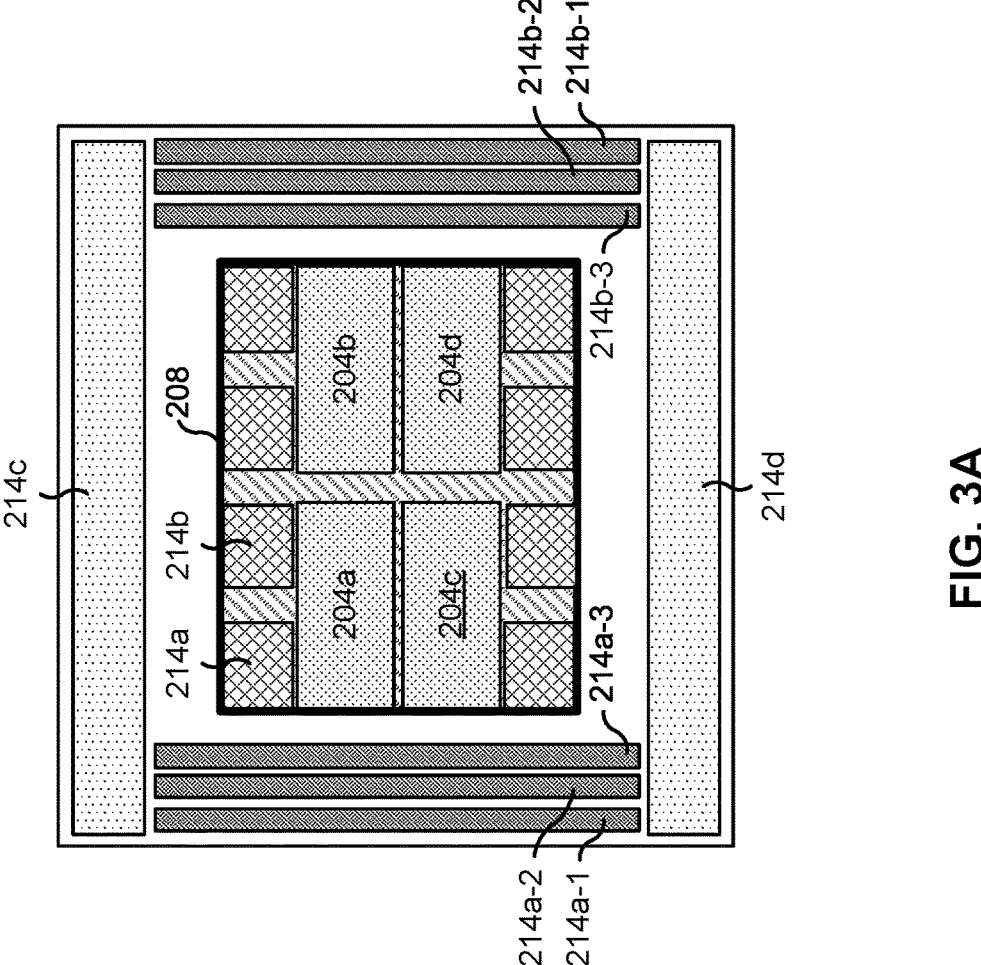
FIGS. 3A-3B are diagrams of an example implementation described herein.
Figure 3B:
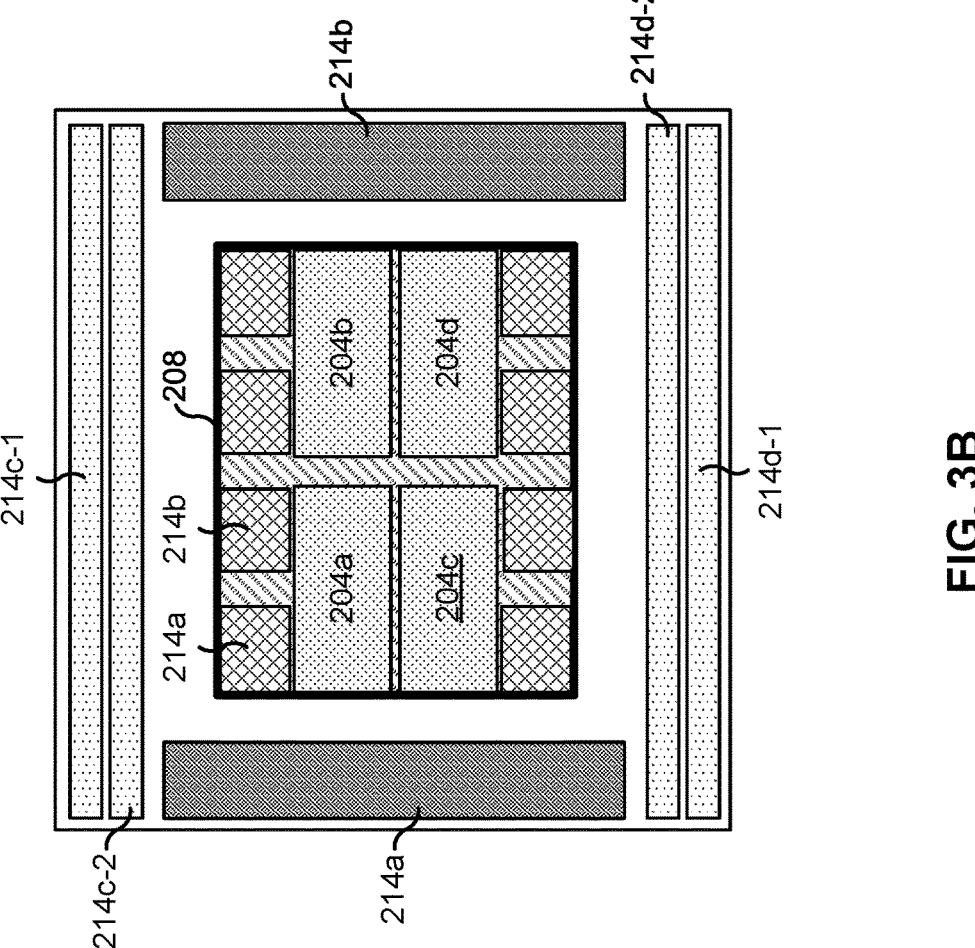

FIGS. 3A-3B are diagrams of example implementations 300 and 350, respectively, of an electronics package (or another semiconductor package) described herein. In some implementations, the semiconductor package corresponds to a 3DIC. FIGS. 3A and 3B represent top views of the of the semiconductor package.

Example implementation 300 is similar to example implementation 200. As shown in FIG. 3A, the first piece 214a is divided into a first set of rectangular pieces 214a-1, 214a-2, and 214a-3 arrayed (at least substantially) perpendicular to one side of the substrate 202. Although described as having three rectangular pieces, the description similarly applies to fewer pieces (e.g., two rectangular pieces) or additional pieces (e.g., four rectangular pieces, five rectangular pieces, and so on). As further shown in FIG. 3A, the first piece 214b is divided into a second set of rectangular pieces 214b-1, 214b-2, and 214b-3 arrayed (at least substantially) perpendicular to another side of the substrate 202. Although described as having three rectangular pieces, the description similarly applies to fewer pieces (e.g., two rectangular pieces) or additional pieces (e.g., four rectangular pieces, five rectangular pieces, and so on). The first set of rectangular pieces 214a-1, 214a-2, and 214a-3 are substantially parallel to the second set of rectangular pieces 214b-1, 214b-2, and 214b-3. As used herein, "substantially parallel" refers to being in a range from 0° to 2° of parallel consistent with Euclidean geometry. Although described as having equal quantities of rectangular pieces, the first set of rectangular pieces may have more pieces or fewer pieces than the second set of rectangular pieces. By dividing the first piece 214a and/or the first piece 214b into sets of rectangular pieces, an ability of the substrate 202 to flex without warping along the axis associated with the first piece 214a and the first piece 214b may be increased.

Example implementation 350 is similar to example implementation 300. As shown in FIG. 3B, the second piece 214c is divided into a first set of rectangular pieces 214c-1 and 214c-2 arrayed (at least substantially) perpendicular to one side of the substrate 202. Although described as having two rectangular pieces, the description similarly applies to additional pieces (e.g., three rectangular pieces, four rectangular pieces, and so on). As further shown in FIG. 3B, the second piece 214d is divided into a second set of rectangular pieces 214d-1 and 214d-2 arrayed (at least substantially) perpendicular to another side of the substrate 202. Although described as having two rectangular pieces, the description similarly applies to additional pieces (e.g., three rectangular pieces, four rectangular pieces, and so on). The first set of rectangular pieces 214c-1 and 214c-2 are substantially parallel to the second set of rectangular pieces 214d-1 and 214d-2. Although described as having equal quantities of rectangular pieces, the first set of rectangular pieces may have more pieces or fewer pieces than the second set of rectangular pieces. By dividing the second piece 214c and/or the second piece 214d into sets of rectangular pieces, the flexibility of the substrate 202 may be increased along the axis associated with the second piece 214c and the second piece 214d.

Example implementations 300 and 350 may be combined. For example, the first pieces 214a and/or 214b may be divided into sets of rectangular pieces as well as the second pieces 214c and/or 214d. Accordingly, an ability of the substrate 202 to flex without warping along the axis associated with the first piece 214a and the first piece 214b and along the axis associated with the second piece 214c and the second piece 214d may be increased.

As indicated above, FIGS. 3A-3B are provided as an example. Other examples may differ from what is described with regard to FIGS. 3A-3B.

Figure 4A:
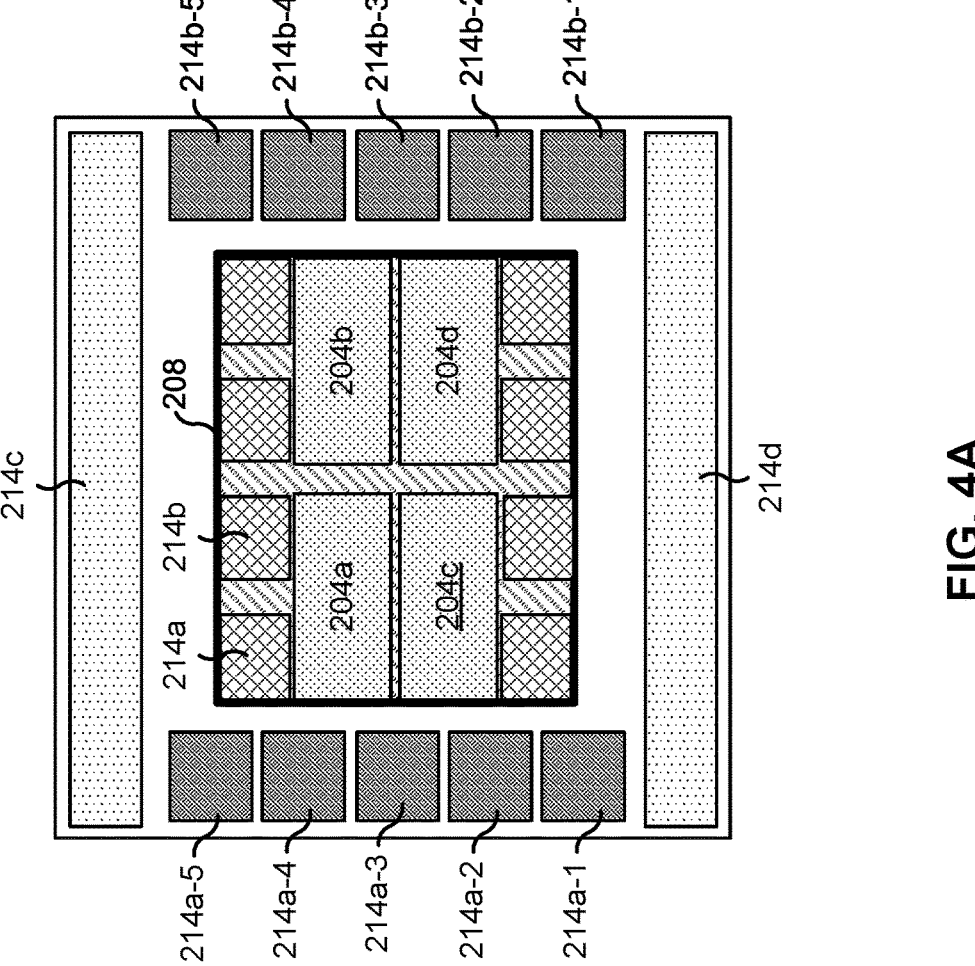
FIGS. 4A-4B are diagrams of an example implementation described herein.
Figure 4B:
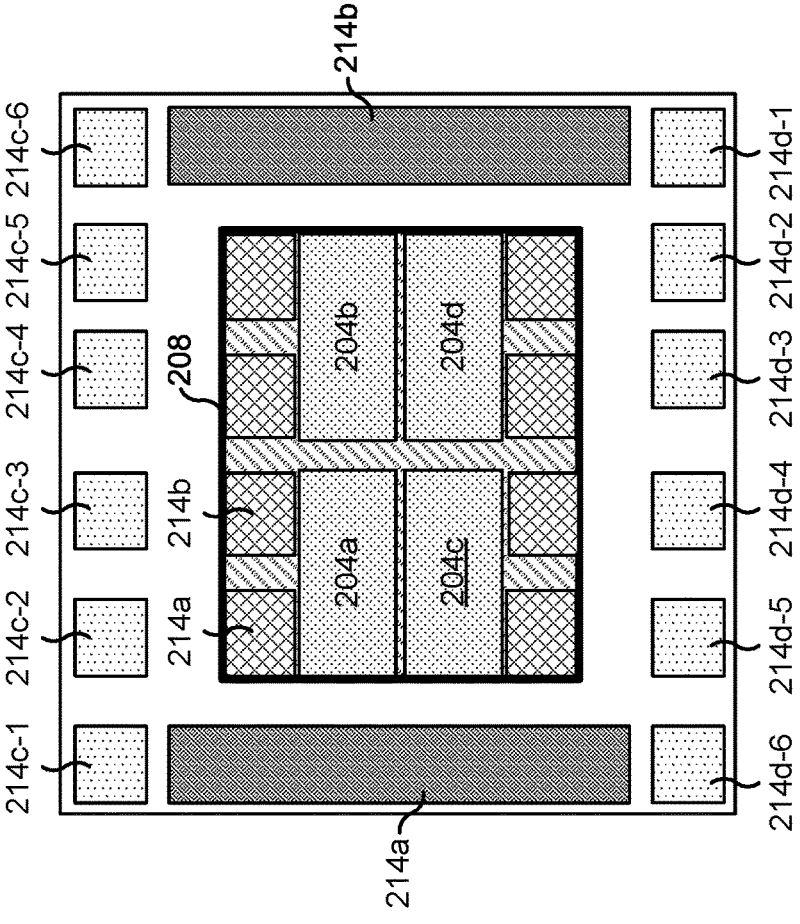

FIGS. 4A-4B are diagrams of example implementations 400 and 450, respectively, of an electronics package (or another semiconductor package) described herein. In some implementations, the semiconductor package corresponds to a 3DIC. FIGS. 4A and 4B represent top views of the of the semiconductor package.

Example implementation 400 is similar to example implementation 200. As shown in FIG. 4A, the first piece 214a is divided into a first set of rectangular pieces 214a-1, 214a-2, 214a-3, 214a-4, and 214a-5 arrayed (at least substantially) parallel to one side of the substrate 202. Although described as having five rectangular pieces, the description similarly applies to fewer pieces (e.g., four rectangular pieces, three rectangular pieces, and so on) or additional pieces (e.g., six rectangular pieces, seven rectangular pieces, and so on). As further shown in FIG. 4A, the first piece 214b is divided into a second set of rectangular pieces 214b-1, 214b-2, 214b-3, 214b-4, and 214b-5 arrayed (at least substantially) parallel to another side of the substrate 202. Although described as having five rectangular pieces, the description similarly applies to fewer pieces (e.g., four rectangular pieces, three rectangular pieces, and so on) or additional pieces (e.g., six rectangular pieces, seven rectangular pieces, and so on). The first set of rectangular pieces 214a-1, 214a-2, 214a-3, 214a-4, and 214a-5 are substantially parallel to the second set of rectangular pieces 214b-1, 214b-2, 214b-3, 214b-4, and 214b-5. Although described as having equal quantities of rectangular pieces, the first set of rectangular pieces may have more pieces or fewer pieces than the second set of rectangular pieces. By dividing the first piece 214a and/or the first piece 214b into sets of rectangular pieces, an ability of the substrate 202 to flex without warping along the axis associated with the first piece 214a and the first piece 214b may be increased.

Example implementation 450 is similar to example implementation 400. As shown in FIG. 4B, the second piece 214c is divided into a first set of rectangular pieces 214c-1, 214c-2, 214c-3, 214c-4, 214c-5, and 214c-6 arrayed (at least substantially) parallel to one side of the substrate 202. Although described as having six rectangular pieces, the description similarly applies to fewer pieces (e.g., five rectangular pieces, four rectangular pieces, and so on) or additional pieces (e.g., seven rectangular pieces, eight rectangular pieces, and so on). As further shown in FIG. 4B, the second piece 214*d* is divided into a second set of rectangular pieces 214*d*-1, 214*d*-2, 214*d*-3, 214*d*-4, 214*d*-5, and 214*d*-6 arrayed (at least substantially) parallel to another side of the substrate 202. Although described as having six rectangular pieces, the description similarly applies to fewer pieces (e.g., five rectangular pieces, four rectangular pieces, and so on) or additional pieces (e.g., seven rectangular pieces, eight rectangular pieces, and so on). The first set of rectangular pieces 214*c*-1, 214*c*-2, 214*c*-3, 214*c*-4, 214*c*-5, and 214*c*-6 are substantially parallel to the second set of rectangular pieces 214*d*-1, 214*d*-2, 214*d*-3, 214*d*-4, 214*d*-5, and 214*d*-6. Although described as having equal quantities of rectangular pieces, the first set of rectangular pieces may have more pieces or fewer pieces than the second set of rectangular pieces. By dividing the second piece 214*c* and/or the second piece 214*d* into sets of rectangular pieces, the flexibility of the substrate 202 may be increased along the axis associated with the second piece 214*c* and the second piece 214*d*.

Example implementations 400 and 450 may be combined. For example, the first pieces 214*a* and/or 214*b* may be divided into sets of rectangular pieces as well as the second pieces 214*c* and/or 214*d*. Accordingly, an ability of the substrate 202 to flex without warping along the axis associated with the first piece 214*a* and the first piece 214*b* and along the axis associated with the second piece 214*c* and the second piece 214*d* may be increased.

Alternatively, example implementation 400 may be combined with example implementation 350, or example implementation 450 may be combined with example implementation 300. Accordingly, the first pieces 214*a* and/or 214*b* may be divided into sets of rectangular pieces that are different from the sets of rectangular pieces into which the second pieces 214*c* and/or 214*d* are divided.

As indicated above, FIGS. 4A-4B are provided as an example. Other examples may differ from what is described with regard to FIGS. 4A-4B.

Figure 5A:
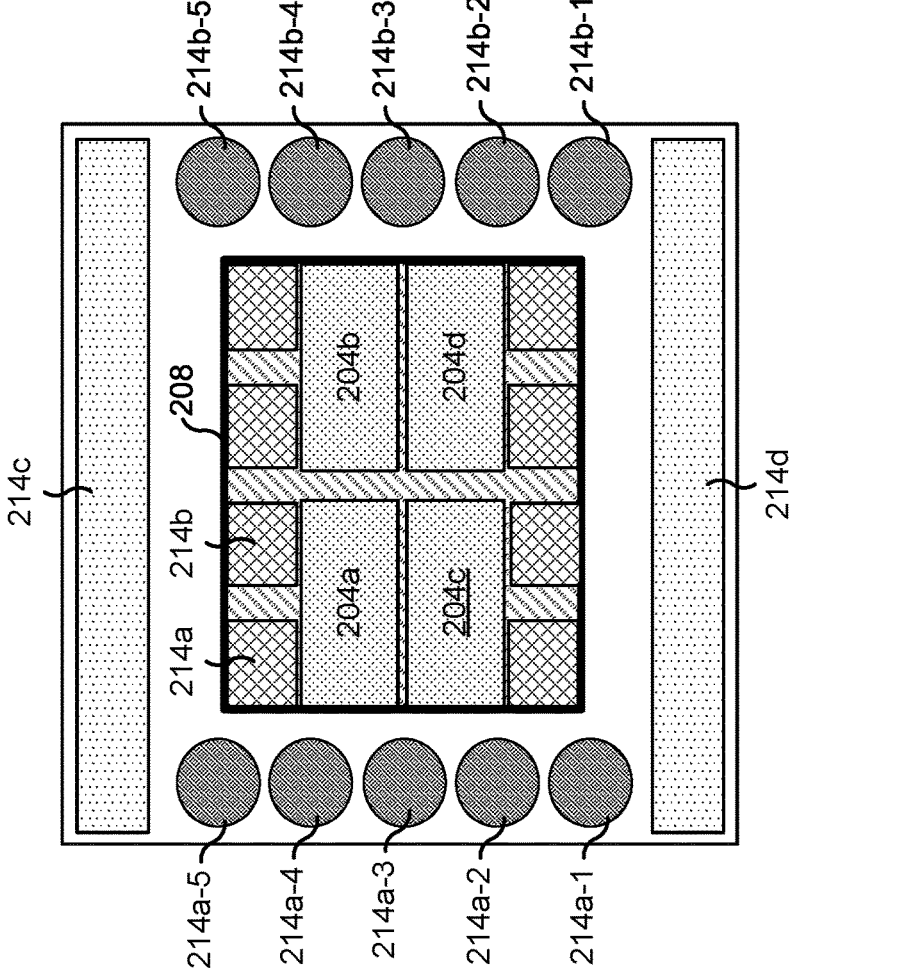
FIGS. 5A-5B are diagrams of an example implementation described herein.
Figure 5B:
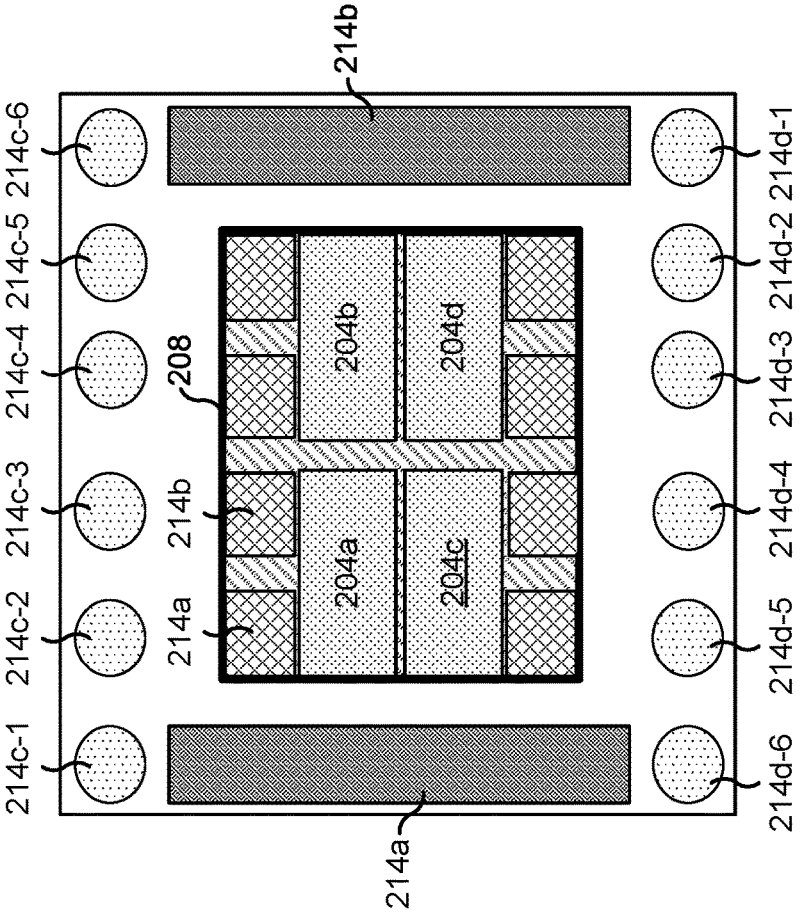

FIGS. 5A-5B are diagrams of example implementations 500 and 550, respectively, of an electronics package (or another semiconductor package) described herein. In some implementations, the semiconductor package corresponds to a 3DIC. FIGS. 5A and 5B represent top views of the of the semiconductor package.

Example implementation 500 is similar to example implementation 200. As shown in FIG. 5A, the first piece 214*a* is divided into a first set of elliptical pieces 214*a*-1, 214*a*-2, 214*a*-3, 214*a*-4, and 214*a*-5 arrayed (at least substantially) parallel to one side of the substrate 202. Although described as having five elliptical pieces, the description similarly applies to fewer pieces (e.g., four elliptical pieces, three elliptical pieces, and so on) or additional pieces (e.g., six elliptical pieces, seven elliptical pieces, and so on). As further shown in FIG. 5A, the first piece 214*b* is divided into a second set of elliptical pieces 214*b*-1, 214*b*-2, 214*b*-3, 214*b*-4, and 214*b*-5 arrayed (at least substantially) parallel to another side of the substrate 202. Although described as having five elliptical pieces, the description similarly applies to fewer pieces (e.g., four elliptical pieces, three elliptical pieces, and so on) or additional pieces (e.g., six elliptical pieces, seven elliptical pieces, and so on). The first set of elliptical pieces 214*a*-1, 214*a*-2, 214*a*-3, 214*a*-4, and 214*a*-5 are substantially parallel to the second set of elliptical pieces

214*b*-1, 214*b*-2, 214*b*-3, 214*b*-4, and 214*b*-5. Although described as having equal quantities of elliptical pieces, the first set of elliptical pieces may have more pieces or fewer pieces than the second set of elliptical pieces. By dividing the first piece 214*a* and/or the first piece 214*b* into sets of elliptical pieces, an ability of the substrate 202 to flex without warping along the axis associated with the first piece 214*a* and the first piece 214*b* may be increased.

Example implementation 550 is similar to example implementation 500. As shown in FIG. 5B, the second piece 214*c* is divided into a first set of elliptical pieces 214*c*-1, 214*c*-2, 214*c*-3, 214*c*-4, 214*c*-5, and 214*c*-6 arrayed (at least substantially) parallel to one side of the substrate 202. Although described as having six elliptical pieces, the description similarly applies to fewer pieces (e.g., five elliptical pieces, four elliptical pieces, and so on) or additional pieces (e.g., seven elliptical pieces, eight elliptical pieces, and so on). As further shown in FIG. 5B, the second piece 214*d* is divided into a second set of elliptical pieces 214*d*-1, 214*d*-2, 214*d*-3, 214*d*-4, 214*d*-5, and 214*d*-6 arrayed (at least substantially) parallel to another side of the substrate 202. Although described as having six elliptical pieces, the description similarly applies to fewer pieces (e.g., five elliptical pieces, four elliptical pieces, and so on) or additional pieces (e.g., seven elliptical pieces, eight elliptical pieces, and so on). The first set of elliptical pieces 214*c*-1, 214*c*-2, 214*c*-3, 214*c*-4, 214*c*-5, and 214*c*-6 are substantially parallel to the second set of elliptical pieces 214*d*-1, 214*d*-2, 214*d*-3, 214*d*-4, 214*d*-5, and 214*d*-6. Although described as having equal quantities of elliptical pieces, the first set of elliptical pieces may have more pieces or fewer pieces than the second set of elliptical pieces. By dividing the second piece 214*c* and/or the second piece 214*d* into sets of elliptical pieces, the flexibility of the substrate 202 may be increased along the axis associated with the second piece 214*c* and the second piece 214*d*.

Example implementations 500 and 550 may be combined. For example, the first pieces 214*a* and/or 214*b* may be divided into sets of elliptical pieces as well as the second pieces 214*c* and/or 214*d*. Accordingly, an ability of the substrate 202 to flex without warping along the axis associated with the first piece 214*a* and the first piece 214*b* and along the axis associated with the second piece 214*c* and the second piece 214*d* may be increased.

Alternatively, example implementation 500 may be combined with example implementation 450 or example implementation 350, or example implementation 550 may be combined with example implementation 400 or example implementation 300. Accordingly, the first pieces 214*a* and/or 214*b* may be divided into sets of elliptical pieces while the second pieces 214*c* and/or 214*d* may be divided into sets of rectangular pieces. Alternatively, the first pieces 214*a* and/or 214*b* may be divided into sets of rectangular pieces while the second pieces 214*c* and/or 214*d* may be divided into sets of elliptical pieces.

As indicated above, FIGS. 5A-5B are provided as an example. Other examples may differ from what is described with regard to FIGS. 5A-5B.

Figure 6:
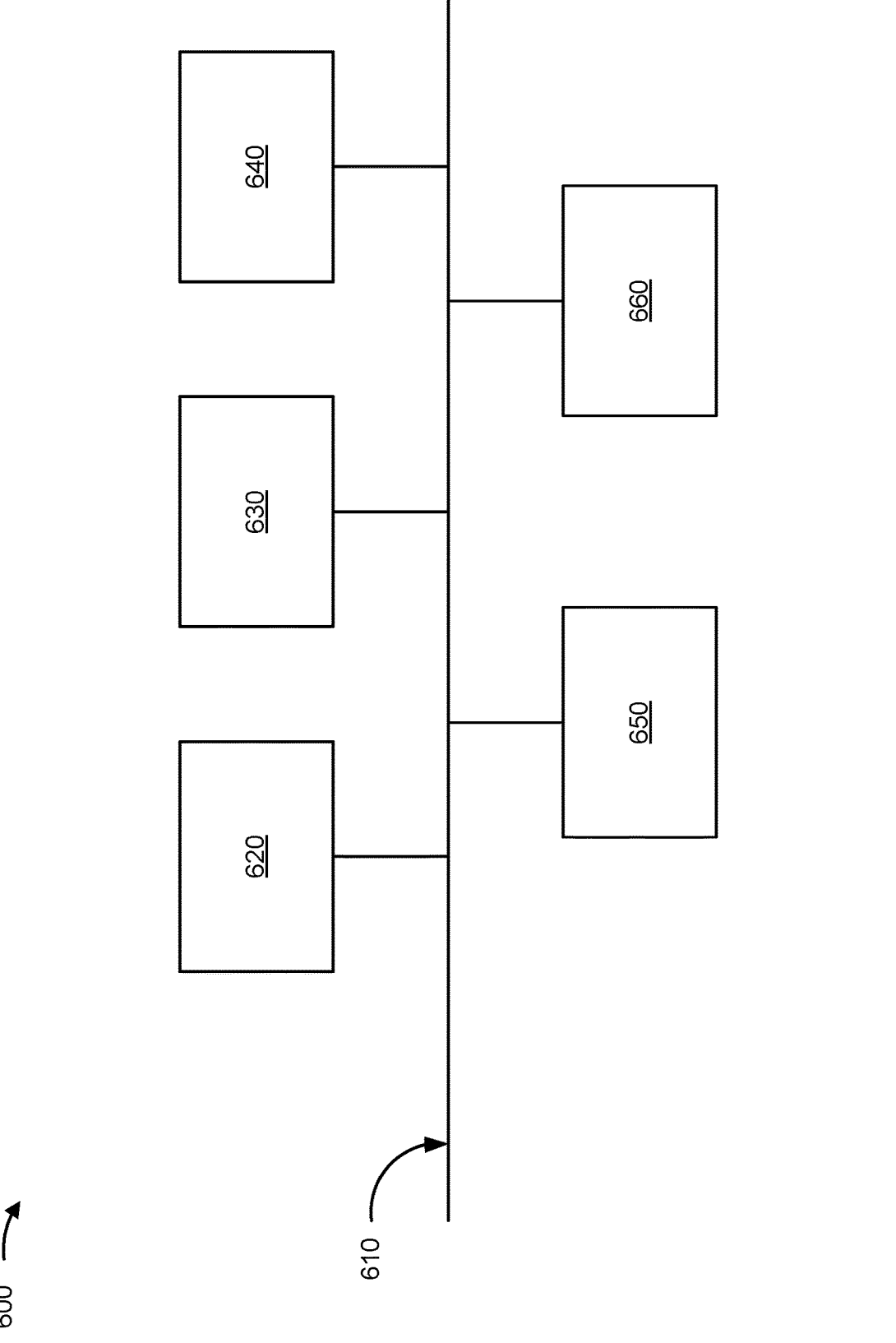
FIG. 6 is a diagram of example components of one or more devices of FIG. 1 described herein.

FIG. 6 is a diagram of example components of a device 600, which may correspond to one or more of the semiconductor processing tool sets 105-150. In some implementations, the semiconductor processing tool sets 105-150 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 associated with forming semiconductor package structures. In some implementations, one or more process blocks of FIG. 7 are performed by one or more of the semiconductor processing tool sets 105-150. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a first ring structure dimensioned to surround one or more semiconductor dies on a substrate, the first ring structure comprising a plurality of first pieces associated with a first axis and a plurality of second pieces associated with a second axis perpendicular to the first axis (block 710). For example, one or more of the semiconductor processing tool sets 105-150, such as the PCB tool set 140, may form a first ring structure 214 dimensioned to surround one or more semiconductor dies 204 on a substrate 202, the first ring structure 214 comprising a plurality of first pieces associated with a first axis and a plurality of second pieces associated with a second axis perpendicular to the first axis, as described herein.

As further shown in FIG. 7, process 700 may include attaching the first ring structure to the substrate (block 720). For example, one or more of the semiconductor processing tool sets 105-150, such as the SMT tool set 145, may attach the first ring structure 214 to the substrate 202, as described herein.

As further shown in FIG. 7, process 700 may include forming a second ring structure dimensioned to cover the first ring structure, the second ring structure being formed of a single piece (block 730). For example, one or more of the semiconductor processing tool sets 105-150, such as the PCB tool set 140, may form a second ring structure 218 dimensioned to cover the first ring structure 214, the second ring structure 218 being formed of a single piece, as described herein.

As further shown in FIG. 7, process 700 may include attaching the second ring structure to the first ring structure (block 740). For example, one or more of the semiconductor processing tool sets 105-150, such as the SMT tool set 145, may attach the second ring structure 218 to the first ring structure 214, as described herein.

Process 700 may include additional implementations, such as any single implementation or any combination of implementations described below and/or in connection with one or more other processes described elsewhere herein.

In a first implementation, attaching the first ring structure 214 to the substrate 202 include depositing an adhesive 212 on the substrate 202, and placing the first ring structure 214 on the deposited adhesive 212.

In a second implementation, alone or in combination with the first implementation, attaching the second ring structure 218 to the first ring structure 214 includes depositing an adhesive 216 on the first ring structure 214, and placing the second ring structure 218 on the deposited adhesive 216.

In a third implementation, alone or in combination with one or more of the first and second implementations, process 700 further includes placing a heat dissipation device 220 on the second ring structure 218.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

In this way, a ring structure on a package substrate is divided into at least four different components, including a plurality of first pieces and a plurality of second pieces. By dividing the ring structure into at least four different components, the ring structure reduces a flexibility of the package substrate, which thus reduces stress on a molding compound (e.g., in a range from approximately 1% to approximately 10%). As a result, molding cracking is reduced, which reduces defect rates and increases yield. Accordingly, raw materials, power, and processing resources are conserved that would otherwise be consumed with manufacturing additional packages when defect rates are higher.

As described in greater detail above, some implementations described herein provide a semiconductor structure. The semiconductor structure includes a substrate supporting one or more semiconductor dies. The semiconductor structure further includes a first ring structure over the substrate and surrounding the one or more semiconductor dies, the first ring structure comprising a plurality of first pieces associated with a first axis that are formed of a first material and a plurality of second pieces associated with a second axis perpendicular to the first axis that are formed of a second material. The first material has a smaller coefficient of thermal expansion than the second material. The semiconductor structure additionally includes a second ring structure over the first ring structure, the second ring structure comprising a single piece.

As described in greater detail above, some implementations described herein provide a method. The method includes forming a first ring structure dimensioned to surround one or more semiconductor dies on a substrate, wherein the first ring structure comprises a plurality of first pieces associated with a first axis and a plurality of second pieces associated with a second axis perpendicular to the first axis. The method further includes attaching the first ring structure to the substrate. The method includes forming a second ring structure dimensioned to cover the first ring structure, wherein the second ring structure is formed of a single piece. The method further includes attaching the second ring structure to the first ring structure.

As described in greater detail above, some implementations described herein provide an electronics package. The electronics package includes one or more semiconductor dies over an interposer structure and supported by a substrate. The electronics package further includes molding surrounding the one or more semiconductor dies. The electronics package includes a first ring structure over the substrate and surrounding the molding, the first ring structure comprising a plurality of first pieces associated with a first axis and a plurality of second pieces associated with a second axis perpendicular to the first axis. The electronics package further includes a second ring structure over the first ring structure, the second ring structure comprising a single piece.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate supporting one or more semiconductor dies;
an interposer on a top surface of the substrate,
    wherein the one or more semiconductor dies are over the interposer;
a first ring structure mounted to the top surface of the substrate and surrounding the one or more semiconductor dies and the interposer,
    wherein the first ring structure comprises a plurality of first pieces associated with a first axis that are formed of a first material and a plurality of second pieces associated with a second axis perpendicular to the first axis that are formed of a second material,
    wherein the first material has a smaller coefficient of thermal expansion than the second material,
    wherein the first ring structure is spaced apart from the interposer and the one or more semiconductor dies in at least one of a direction along the first axis or a direction along the second axis, and
    wherein a top surface of the first ring structure is a greater height with respect to the top surface of the substrate than a top surface of the one or more semiconductor dies; and
a second ring structure over the first ring structure, wherein the second ring structure comprises a single piece.

2. The semiconductor structure of claim 1, wherein the plurality of first pieces are associated with a length that is shorter than a length associated with the plurality of second pieces.

3. The semiconductor structure of claim 1, wherein the plurality of first pieces are associated with a length that is longer than a length associated with the plurality of second pieces.

4. The semiconductor structure of claim 1, wherein a spacing between one of the plurality of first pieces and one of the plurality of second pieces is in a range from approximately 0.01% to approximately 1.0% of a length associated with the plurality of first pieces.

5. The semiconductor structure of claim 1, wherein a spacing between one of the plurality of first pieces and one of the plurality of second pieces is in a range from approximately 0.01% to approximately 1.0% of a length associated with the plurality of second pieces.

6. The semiconductor structure of claim 1, wherein the first material has a coefficient of thermal expansion in a range from approximately 0.1 parts-per-million per degree Celsius (ppm/° C.) to approximately 2.5 ppm/° C.

7. The semiconductor structure of claim 1, wherein the second material has a coefficient of thermal expansion in a range from approximately 16.0 parts-per-million per degree Celsius (ppm/° C.) to approximately 20.0 ppm/° C.

8. The semiconductor structure of claim 1, wherein the plurality of first pieces comprise a first set of rectangular pieces, arrayed perpendicular to one side of the substrate, that are substantially parallel to a second set of rectangular pieces arrayed perpendicular to another side of the substrate.

9. The semiconductor structure of claim 1, wherein the plurality of first pieces comprise a first set of rectangular pieces, arrayed parallel to one side of the substrate, that are substantially parallel to a second set of rectangular pieces arrayed parallel to another side of the substrate.

10. The semiconductor structure of claim 1, wherein the plurality of first pieces comprise a first set of elliptical pieces, arrayed parallel to one side of the substrate, that are substantially parallel to a second set of elliptical pieces arrayed parallel to another side of the substrate.

11. The semiconductor structure of claim 1, wherein the plurality of second pieces comprise a first set of rectangular pieces, arrayed perpendicular to one side of the substrate, that are substantially parallel to a second set of rectangular pieces arrayed perpendicular to another side of the substrate.

12. An electronics package, comprising:

one or more semiconductor dies over an interposer structure and supported by a substrate;

molding surrounding the one or more semiconductor dies, wherein the molding and the interposer structure are on a top surface of the substrate;

a first ring structure mounted to the top surface of the substrate and surrounding the molding and the interposer structure, wherein the first ring structure comprises a plurality of first pieces associated with a first axis and a plurality of second pieces associated with a second axis perpendicular to the first axis, wherein the first ring structure is spaced apart from the molding, the interposer structure, and the one or more semiconductor dies in at least one of a direction along the first axis or a direction along the second axis, and wherein a top surface of the first ring structure is a greater height with respect to the top surface of the substrate than a top surface of the one or more semiconductor dies; and a second ring structure over the first ring structure, wherein the second ring structure comprises a single piece.

13. The electronics package of claim 12, wherein the plurality of first pieces are formed of a first material and the plurality of second pieces are formed of a second material, wherein the first material has a smaller coefficient of thermal expansion than the second material.

14. The electronics package of claim 13, wherein the first material is a 36% nickel-iron alloy.

15. The electronics package of claim 13, wherein the second material is selected from stainless steel, copper, or an alloy thereof.

16. The electronics package of claim 12, further comprising:

a heat dissipation device including a fan over the second ring structure.

17. A structure, comprising:

a substrate supporting one or more semiconductor dies;

an interposer on a top surface of the substrate, wherein the one or more semiconductor dies are over the interposer;

a first ring structure mounted to the top surface of the substrate and around the one or more semiconductor dies and the interposer, wherein the first ring structure comprises:

a plurality of first pieces associated with a first axis, and a plurality of second pieces associated with a second axis perpendicular to the first axis, wherein the first ring structure is spaced apart from the interposer and the one or more semiconductor dies in at least one of a direction along the first axis or a direction along the second axis, and wherein a top surface of the first ring structure is a greater height with respect to the top surface of the substrate than a top surface of the one or more semiconductor dies; and a second ring structure over the first ring structure, wherein the second ring structure comprises a single piece.

18. The structure of claim 17, wherein:

the plurality of first pieces comprise a first material, the plurality of second pieces comprise a second material, and the first material has a different coefficient of thermal expansion than the second material.

19. The structure of claim 18, wherein:

the first material has a coefficient of thermal expansion in a range from approximately 0.1 parts-per-million per degree Celsius (ppm/° C.) to approximately 2.5 ppm/° C., and the second material has a coefficient of thermal expansion in a range from approximately 16.0 parts-per-million per degree Celsius (ppm/° C.) to approximately 20.0 ppm/° C.

20. The structure of claim 18, wherein:

the first material is a 36% nickel-iron alloy, and the second material is stainless steel, copper, or an alloy thereof.

* * * * *